(12) United States Patent
Kao et al.

(10) Patent No.: US 9,281,380 B2
(45) Date of Patent: Mar. 8, 2016

(54) TRANSISTOR STRUCTURE AND MANUFACTURING METHOD THEREOF

(71) Applicant: Wistron Corporation, New Taipei (TW)

(72) Inventors: Chi-Jen Kao, New Taipei (TW);
Yu-Jung Peng, New Taipei (TW);
Yi-Kai Wang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/452,539

(22) Filed: Aug. 6, 2014

(65) Prior Publication Data

US 2015/0235967 A1   Aug. 20, 2015

(30) Foreign Application Priority Data

Feb. 18, 2014 (TW) .............................. 103105304 A

(51) Int. Cl.
| | |
|---|---|
| *H01L 23/552* | (2006.01) |
| *H01L 29/66* | (2006.01) |
| *H01L 29/786* | (2006.01) |
| *H01L 51/10* | (2006.01) |
| *H01L 51/05* | (2006.01) |

(52) U.S. Cl.
CPC ........ *H01L 29/66742* (2013.01); *H01L 29/786* (2013.01); *H01L 29/7869* (2013.01); *H01L 51/10* (2013.01); *H01L 51/0545* (2013.01)

(58) Field of Classification Search
CPC . H01L 29/66742; H01L 29/786; H01L 51/10; H01L 29/7869
See application file for complete search history.

(56) References Cited

U.S. PATENT DOCUMENTS

| | | | |
|---|---|---|---|
| 6,906,779 B2 | 6/2005 | Chan-Park et al. | |
| 8,766,266 B2 * | 7/2014 | Katsuhara et al. | 257/59 |
| 2007/0090365 A1 | 4/2007 | Hayashi et al. | |
| 2010/0289020 A1 | 11/2010 | Yano et al. | |
| 2014/0183521 A1 * | 7/2014 | Hsu et al. | 257/43 |
| 2015/0137091 A1 * | 5/2015 | Lan et al. | 257/40 |

FOREIGN PATENT DOCUMENTS

| | | |
|---|---|---|
| TW | 556044 | 10/2003 |
| TW | 200937638 | 9/2009 |

OTHER PUBLICATIONS

Office Action of Taiwan Counterpart Application, issued on Oct. 2, 2015, with English translation thereof, p. 1-p. 20, in which the listed references(Ref. 1-3) were cited.

* cited by examiner

*Primary Examiner* — Long Pham
(74) *Attorney, Agent, or Firm* — Jianq Chyun IP Office

(57) ABSTRACT

A transistor structure including a gate, an insulation layer, a patterned semiconductor layer, a source, a drain and a light absorption layer and a manufacturing method thereof are provided. The gate is disposed on a substrate. An area of the gate overlaps an area of the patterned semiconductor layer. The insulation layer is disposed between the gate and the patterned semiconductor layer. The source and the drain are separated from each other and in contact with the patterned semiconductor layer. The patterned semiconductor layer is disposed between the light absorption layer and the substrate. An area of the light absorption layer overlaps an area of the patterned semiconductor layer. An absorption spectrum of the light absorption layer overlaps an absorption spectrum of the patterned semiconductor layer.

21 Claims, 4 Drawing Sheets

TRANSISTOR STRUCTURE AND MANUFACTURING METHOD THEREOF

CROSS-REFERENCE TO RELATED APPLICATION

This application claims the priority benefit of Taiwan application serial no. 103105304, filed on Feb. 18, 2014. The entirety of the above-mentioned patent application is hereby incorporated by reference herein and made a part of this specification.

BACKGROUND OF THE DISCLOSURE

1. Field of the Disclosure

The disclosure generally relates to a transistor structure and a manufacturing method thereof, and more particularly, to a transistor structure having a light absorption layer and a manufacturing method thereof.

2. Description of Related Art

In recent years, due to the mature optoelectronic technology and the advanced semiconductor fabrication technology, flat panel displays are developed rapidly. Among the flat panel displays, thin film transistor (TFT) displays having advantages of low operation voltage, fast response speed, light weight, and compactness have become mainstream of displays on the market. The TFT displays mainly uses the TFT to control the imaging quality of the display.

However, characteristics of a semiconductor layer in a TFT structure are easily prone to change due to the irradiation of light. Common TFT transistor structures may generally be divided into top-gate TFTs or bottom gate TFTs. In terms of the conventional TFT structure, regardless of being the top-gate TFT or the bottom gate TFT, after it is subjected to the irradiation of a front light source, a backlight source or an external light source, the semiconductor layer in the TFT would produce changes in its characteristics, such as threshold voltage, drive current and subthreshold slope, and thereby leads to a deterioration in the reliability of the TFT.

SUMMARY OF THE DISCLOSURE

Accordingly, the disclosure is directed to a transistor structure and a manufacturing method thereof. The transistor structure has a light absorption layer, and thus capable of preventing a patterned semiconductor layer in the transistor structure from producing characteristic changes due to the irradiation flight.

The disclosure is directed to a transistor structure including a gate, an insulation layer, a patterned semiconductor layer, a source, a drain, and a light absorption layer. The gate is disposed on the substrate. An area of the gate overlaps an area of the patterned semiconductor layer. The insulation layer is located between the gate and the patterned semiconductor layer. The source and the drain are separated from each other, and the source and the drain are contacted at the patterned semiconductor layer. The patterned semiconductor layer is located between the light absorption layer and the substrate. An area of the light absorption layer overlaps the area of the patterned semiconductor layer. An absorption spectrum of the light absorption layer overlaps an absorption spectrum of the patterned semiconductor layer.

In an embodiment of the disclosure, the wavelength of the absorption spectrum of the light absorption layer is from 290 nm to 900 nm.

In an embodiment of the disclosure, a sheet resistance value of the light absorption layer ranges from $10^{12}$ ohm/unit area to area to $10^{15}$ ohm/unit area.

In an embodiment of the disclosure, a material of the light absorption layer includes black photoresist or light absorbable dark color material, wherein an additive in the black photoresist includes any one of a dye, a carbon black and a titanium metal.

In an embodiment of the disclosure, the patterned semiconductor layer is located between the gate and the substrate.

In an embodiment of the disclosure, the light absorption layer directly contacts the gate.

In an embodiment of the disclosure, a profile of the light absorption layer and a profile of the gate are aligned.

In an embodiment of the disclosure, the light absorption layer extends outward from the gate to contact the insulation layer.

In an embodiment of the disclosure, the insulation layer has a first opening, the light absorption layer has a second opening, and the first opening is connected with the second opening to expose a portion of the drain.

In an embodiment of the disclosure, the transistor structure further includes a protective layer covering the gate and the insulation layer, and the gate is located between the protective layer and the insulation layer.

In an embodiment of the disclosure, the protective layer is located between the light absorption layer and the substrate.

In an embodiment of the disclosure, the insulation layer has a first opening, the protective layer has a second opening, and the first opening is connected with the second opening to expose a portion of the drain.

In an embodiment of the disclosure, the insulation layer has an opening, and the opening exposes a portion of the drain.

In an embodiment of the disclosure, the gate is located between the patterned semiconductor layer and the substrate.

In an embodiment of the disclosure, the light absorption layer directly contacts the patterned semiconductor layer.

In an embodiment of the disclosure, a profile of the light absorption layer and a profile of the patterned semiconductor layer are aligned.

In an embodiment of the disclosure, the light absorption layer extends outward from the patterned semiconductor layer to contact the insulation layer.

In an embodiment of the disclosure, the light absorption layer has an opening, and the opening exposes a portion of the drain.

In an embodiment of the disclosure, the transistor structure further includes a protective layer, and the protective layer covers the patterned semiconductor layer, the source and a portion of the drain.

In an embodiment of the disclosure, the protective layer is located between the light absorption layer and the substrate.

In an embodiment of the disclosure, the protective layer has an opening, and the opening exposes another portion of the drain.

In an embodiment of the disclosure, a material of the patterned semiconductor layer includes organic semiconductor material or inorganic semiconductor material.

In an embodiment of the disclosure, a material of the patterned semiconductor layer includes oxidized semiconductor material.

In an embodiment of the disclosure, the substrate is a flexible substrate.

In an embodiment of the disclosure, the source contacts the drain at a side of the patterned semiconductor layer that is close to the substrate.

In an embodiment of the disclosure, the source contacts the drain at a side of the patterned semiconductor layer that is away from the substrate.

The disclosure is directed to a manufacturing method of the transistor structure. A gate is formed on a substrate. An insulation layer and a patterned semiconductor layer are formed so that an area of the gate overlaps an area of the patterned semiconductor layer, and the insulation layer is located between the gate and the patterned semiconductor layer. A source and a drain separated from each other are formed, and the source and the drain are contacted at the patterned semiconductor layer. A light absorption layer is formed so that the patterned semiconductor layer is located between the light absorption layer and the substrate, and an area of the light absorption layer overlaps the area of the patterned semiconductor layer, wherein an absorption spectrum of the light absorption layer overlaps an absorption spectrum of the patterned semiconductor layer.

In an embodiment of the disclosure, the light absorption layer is manufactured by either a dry processing or a wet processing.

In an embodiment of the disclosure, the wet processing includes performing a coating process on the substrate.

In an embodiment of the disclosure, the wet processing includes performing a coating process in a roll-to-roll device.

In an embodiment of the disclosure, the dry processing includes either a physical deposition or a chemical deposition.

In an embodiment of the disclosure, the patterned semiconductor layer is manufactured by either a dry processing or a wet processing.

In an embodiment of the disclosure, the dry processing is performed in a vacuum equipment.

In view of foregoing, the transistor structure of the disclosure has the light absorption layer. And, since the light absorption layer has an absorption spectrum overlapping with that of the patterned semiconductor layer, and the area of the light absorption layer overlaps the area of the patterned semiconductor layer, the transistor structure of the disclosure, under the condition of being irradiated by the light, parts of the light having specific wavelength may firstly be absorbed by the light absorption layer, and then the patterned semiconductor layer in the transistor structure may thus be prevented from producing characteristic changes due to the irradiation of the light.

In order to make the abovementioned and other features and advantages of the present application more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
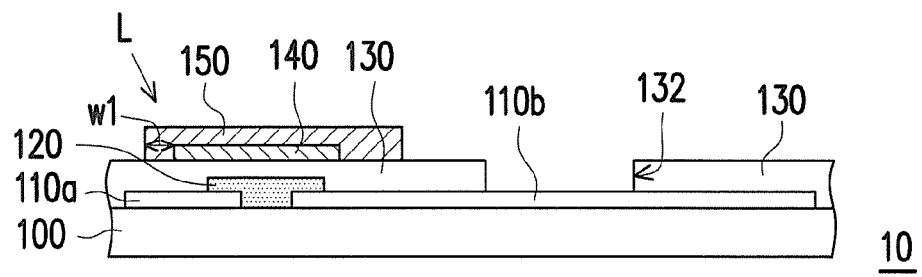
FIG. 1 is a schematic cross-sectional diagram illustrating a transistor structure according to a first embodiment of the disclosure.

FIG. 1 is a schematic cross-sectional diagram illustrating a transistor structure according to a first embodiment of the disclosure. Referring to FIG. 1, in the present embodiment, a transistor structure 10 is disposed on a substrate 100 and includes a source 110a, a drain 110b, a patterned semiconductor layer 120, an insulation layer 130, a gate 140 and a light absorption layer 150. The gate 140 is disposed on the substrate 100. An area of the gate 140 overlaps an area of the patterned semiconductor layer 120, and thus the gate 140 shields the patterned semiconductor layer 120. The insulation layer 130 is located between the gate 140 and the patterned semiconductor layer 120. The source 110a and the drain 110b are separated from each other, and the source 110a and the drain 110b are both contacted at the patterned semiconductor layer 120. The light absorption layer 150 further covers above the gate 140, and thus the patterned semiconductor layer 120 is located between the light absorption layer 150 and the substrate 100. In addition to the above, the transistor structure 10 of the present embodiment further may include a protective layer (not shown) covering the light absorption layer 150 and the insulation layer 130.

Specifically, as shown in FIG. 1, when manufacturing the transistor structure 10, the source 110a and the drain 110b of the present embodiment are firstly disposed on the substrate 100 and expose a portion of the substrate 100, wherein the substrate 100 is a flexible substrate, but may also be a rigid substrate. Namely, the source 110a and the drain 110b are two electrodes being structurally separated from each other. A manufacturing method of the source 110a and the drain 110b, for example, is to firstly folni a conductive material layer on the substrate 100, and then the source 110a and the drain 110b are obtained by patterning the conductive material layer, wherein a manufacturing method of the conductive material layer includes physical deposition, chemical deposition, coating process, printing process and so forth.

Next, the patterned semiconductor layer 120 is disposed on the source 110a an the drain 110b, and the patterned semiconductor layer 120 overlaps the exposed portion of the substrate 100, so as to form a passage between the source 110a and the drain 110b. The patterned semiconductor layer 120 may selectively be manufactured by either a dry processing or a wet processing, and the dry processing may selectively be performed in a vacuum equipment, wherein a material of the patterned semiconductor layer 120 may be oxide semiconductor material, organic semiconductor material or siliceous semiconductor material.

Then, the insulation layer 130 is disposed on the patterned semiconductor layer 120 and overlaps the patterned semiconductor layer 120, the source 110a and the drain 110b. Subsequently, the gate 140 is disposed on the insulation layer 130, wherein a manufacturing method of the gate 140 may be referred to the manufacturing method of the source 110a and the drain 110b. And, the light absorption layer 150 is then disposed on the gate 140. The light absorption layer 150, for example, is manufactured by either the dry processing or the wet processing. In terms of the wet processing, the manufacturing method of the light absorption layer 150 may be to coat the light absorption material, which is in a flow state, on the substrate 100, and to constitute the light absorption layer 150 by curing and patterning the light absorption material. Such coating process may be performed in a roll-to-roll device, and may also selectively be performed directly on the substrate 100 that is horizontally placed on the processing machine. Whereas, the dry processing includes either a physical deposition or a chemical deposition. Namely, the light absorption layer 150 may be formed by depositing the light absorption material on the substrate 100 via the deposition process, and then obtaining the light absorption layer 150 after patterning the deposited light absorption material.

It can be known from FIG. 1, the patterned semiconductor layer 120 of the present embodiment is located between the gate 140 and the substrate 100, and the transistor structure 10 of the present embodiment is a top gate transistor structure. In the present embodiment, the insulation layer 130 may be disposed with a first opening 132 for exposing a portion of the drain 110b, so that the drain 110b is able to couple to other components or drive the other components. When the transistor structure 10 is applied to a display panel, the portion of the drain 110b exposed by the first opening 132 can be used as a pixel electrode for driving a display medium.

Moreover, an area of the light absorption layer 150 overlaps the area of the patterned semiconductor layer 120, and an absorption spectrum of the light absorption layer 150 overlaps an absorption spectrum of the patterned semiconductor layer 120. In detail, a material of the patterned semiconductor layer 120 includes organic semiconductor material, inorganic semiconductor material or oxide semiconductor material, such as an indium gallium zinc oxide and the patterned semiconductor layer 120 has an absorption spectrum ranges from 350 nm to 850 nm. In addition, the absorption spectrum of the light absorption layer 150, for example, ranges from 290 nm to 900 nm. More favorably, when a thickness of the light absorption layer 150 is greater than 1 μm (μm), the light absorption layer 150 may effectively absorb a portion of the light L irradiated from the outside towards the patterned semiconductor layer 120. As a result, a portion of the light having specific wavelength, in the light L irradiated from the outside towards the patterned semiconductor layer 120, which would be absorbed by the patterned semiconductor layer 120 may effectively and firstly be absorbed by the light absorption layer 150, thereby achieving a favorable effect of preventing the patterned semiconductor layer 120 from producing characteristic change due to the irradiation of the light L. However, the thickness of the light absorption layer 150 may be adjusted according to the material being selected. As an absorption rate of the selected material within the range of the aforementioned absorption spectrum becomes higher, the light absorption layer 150 may attain an ideal absorption effect without having a thick thickness. Relatively, as an absorption rate of the selected material within the range of the aforementioned absorption spectrum becomes lower, the light absorption layer 150 must be even relatively thicker so as to attain an ideal absorption effect.

In addition to the above, since a sheet resistance value of the light absorption layer 150 ranges between $10^{12}$ ohm/unit area and $10^{15}$ ohm/unit area, the light absorption layer 150 may be considered as an insulating member and configured as in direct contact with the gate 140. Namely, the light absorption layer 150 and the gate 140 do not necessary have to sandwich an insulation layer therebetween. At the same time, the design of covering the gate 140 with the light absorption layer 150 may be considered as a protective layer for protecting the gate 140. For instance, the light absorption layer 150 extends a width w1 outward from the edge of the gate 140, so as to cover the gate 140, wherein the width w1 may be 3 μm to 5 μm. Certainly, in other embodiments, the size of the width w1 may be adjusted according to the processing conditions and the layout designs of the components. Moreover, in terms of the present embodiment, a material of the light absorption layer 150 which complies with the abovementioned requirements may, for example, be a black photoresist or a light absorbable dark color material, wherein an additive in the black photoresist includes any one of a dye, a carbon black and a titanium metal.

Figure 2:
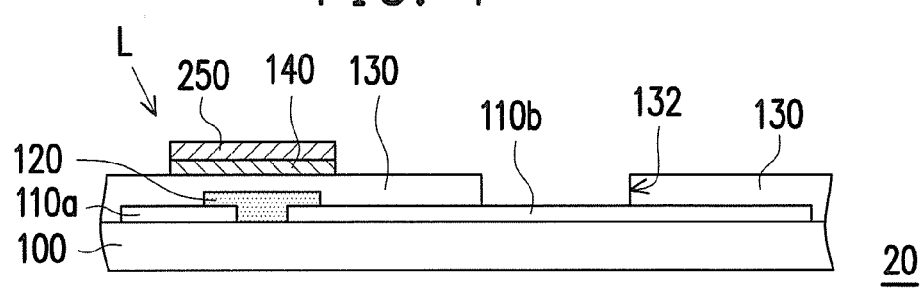
FIG. 2 is a schematic cross-sectional diagram illustrating a transistor structure according to a second embodiment of the disclosure.

FIG. 2 is a schematic cross-sectional diagram illustrating a transistor structure according to a second embodiment of the disclosure. Referring to FIG. 2, in the present embodiment, a transistor structure 20 is similar to the transistor structure 10, and similar components in the both embodiments are indicated by same notations and have similar functions; and thus further elaborations are omitted. A main difference between the transistor structure 20 and the transistor structure 10 lies in that a profile of a light absorption layer 250 and a profile of the gate 140 are aligned or almost aligned. Herein, it is to be explained that, "the profile being aligned or almost aligned" indicates that the light absorption layer 250 and the gate 140 are patterned by using the same mask or performing a single patterning step, and thus non-aligned profile produced by variations during the fabrication process is also included in the feature of "the profile being aligned or almost aligned". For instance, in the case the gate 140 and the light absorption layer 250 are patterned in a single patterning step, owing to the variations during the fabrication process, a distance between the edge of the light absorption layer 250 and the edge of the gate 140 may be 3 μm to 5 μm, or smaller than 0.5 μm. As compared to the manufacturing method of the transistor structure 10, the transistor structure 20 of the present embodiment may reduce the use of a mask because the gate 140 and the light absorption layer 250 are patterned by performing a single patterning step.

In detail, the insulation layer 130 is formed on the patterned semiconductor layer 120 and overlaps the patterned semiconductor layer 120, the source 110a and the drain 110b. Thereafter, a light absorption material layer and a gate material layer (not shown) may sequentially deposit on the insulation layer 130, and then a same mask is used to pattern the aforesaid to material layers to form the gate 140 and the light absorption layer 250. Accordingly, the formed transistor structure 20 has the profile of the light absorption layer 250 and the profile of the gate 140 being aligned or almost aligned. Otherwise, the gate 140 and the light absorption layer 250 may be formed by adopting the same mask but different patterning steps. According to the above, in the manufacturing method of the transistor structure 20, the area of the gate 140 overlaps the area of the patterned semiconductor layer 120, and thus the area of the light absorption layer 250 also overlaps the area of the patterned semiconductor layer 120.

On the present embodiment, the absorption spectrum of the light absorption layer 250 overlaps the absorption spectrum of the patterned semiconductor layer 120, and the area of the light absorption layer 250 shields the area of the patterned semiconductor layer 120, which thereby may prevent the patterned semiconductor layer 120 from producing characteristic changes due to the irradiation of the light L. Hence, the transistor 20 has favorable reliability. In the present embodiment, the area of the light absorption layer 250 may completely shield the area of the patterned semiconductor layer 120, or the area of the light absorption layer 250 may shield over 95% of the area of the patterned semiconductor layer 120, so that the transistor 20 may have favorable reliability.

Figure 3:
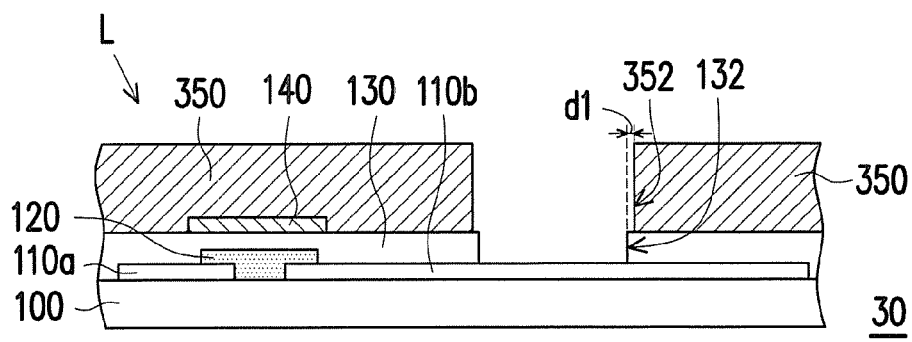
FIG. 3 is a schematic cross-sectional diagram illustrating a transistor structure according to a third embodiment of the disclosure.

FIG. 3 is a schematic cross-sectional diagram illustrating a transistor structure according to a third embodiment of the disclosure. Referring to FIG. 3, in the present embodiment, a transistor structure 30 is similar to the transistor structure 10, and similar components in the both embodiments are indicated by same notations and have similar functions; and thus further elaborations are omitted. A main difference between the transistor structure 30 and the transistor structure 10 lies in that a light absorption layer 350 extends outward from the gate 140 to contact a majority of the area of the insulation layer 130.

In detail, after the gate 140 is formed on the insulation layer 130, the light absorption layer 350 is then formed on the gate 140. And, a sheet resistance value of the light absorption layer 350 ranges between $10^{12}$ ohm/unit area and $10^{15}$ ohm/unit area, and thus the light absorption layer 350 may be considered as an insulating member. Since the light absorption layer 350 extends outward from the gate 140 extends outward to contact the majority of the area of the insulation layer 130, the light absorption layer 350 of the present embodiment has the same function as the aforementioned protective layer, and this design may omit the subsequent processing steps for manufacturing the protective layer. Based on the manufacturing method of the transistor structure 30, the light absorption layer 350 extends outward from the gate 140 to contact the insulation layer 130, and thus the area of the light absorption layer 350 also overlaps the whole area of the patterned semiconductor layer 120.

Furthermore, in the present embodiment, the insulation layer 130 has a first opening 132, and the light absorption layer 350 has a second opening 352. The first opening 132 and the second opening 352 are mutually connected to expose a portion of the drain 110b. The exposed portion of the drain 110b may be provided for coupling with the other components or driving the other components. When the transistor structure 30 is applied to a display panel, the portion of the drain 110b being exposed by the first opening 132 and the second opening 352 is then used as a pixel electrode for driving a display medium. In the present embodiment, the second opening 352 is set as slight larger than the first opening 132, and a distance d1 between the edge of the first opening 132 and the edge of the second opening 352 may be 3 μm to 5 μm, or less than 0.5 μm, but the disclosure is not limited thereto. In other embodiments, the second opening 352 may selectively be set as slightly smaller or equal to the first opening 132. When the second opening 352 is set as equal to the first opening 132, these two openings can even be formed by adopting a same mask and be formed by being patterned in different steps.

Figure 4:
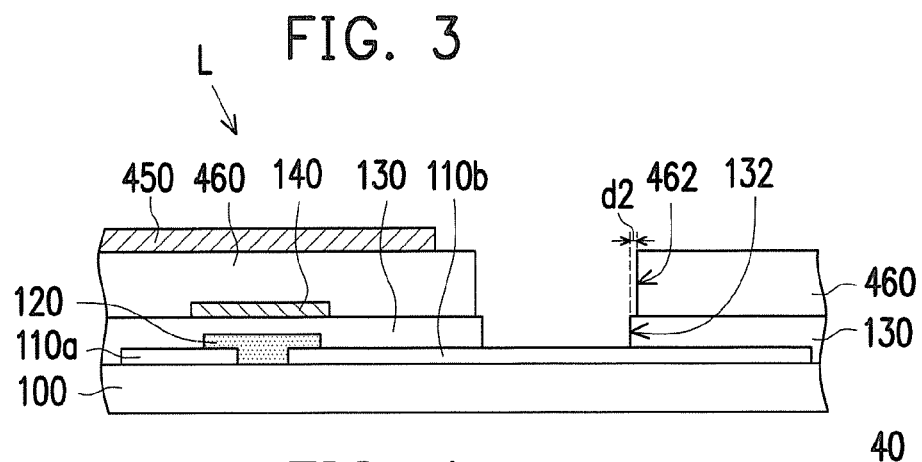
FIG. 4 is a schematic cross-sectional diagram illustrating a transistor structure according to a fourth embodiment of the disclosure.

FIG. 4 is a schematic cross-sectional diagram illustrating a transistor structure according to a fourth embodiment of the disclosure. Referring to FIG. 4, in the present embodiment, a transistor structure 40 is similar to the transistor structure 10, and similar components in the both embodiments are indicated by same notations and have similar functions; and thus further elaborations are omitted. A main difference between the transistor structure 40 and the transistor structure 10 mainly lies in that the transistor structure 40 further includes a protective layer 460 covering the gate 140 and the insulation layer 130. Herein, the gate 140 is located between the protective layer 460 and the insulation layer 130, and the protective layer 460 is located between the light absorption layer 450 and the substrate 100.

In detail, after the gate 140 is formed on the insulation layer 130, the protective layer 460 is then formed on the gate 140, wherein the protective layer 460 extends outward from the gate 140 to contact the majority of the area of the insulation layer 130. Afterward, the light absorption layer 450 is then formed on the protective layer 460, wherein an area of the light absorption layer 450 overlaps the area of the patterned semiconductor layer 120. Hence, the light absorption layer 450 may shield the patterned semiconductor layer 120. In the present embodiment, the area of the light absorption layer 450 may completely shield the area of the patterned semiconductor layer 120, or the area of the light absorption layer 450 may shield over 95% of the area of the patterned semiconductor layer 120, so that the transistor 40 may have favorable reliability.

In the present embodiment, the patterned semiconductor layer 120 has an absorption spectrum of 350 nm to 850 nm, the light absorption layer 450 has an absorption spectrum of 290 nm to 900 nm, and the area of the light absorption layer 450 overlaps the area of the patterned semiconductor layer 120. As a result, a portion of the light having specific wavelength, in the light L irradiated from the outside towards the patterned semiconductor layer 120, which would be absorbed by the patterned semiconductor layer 120 is firstly absorbed by the light absorption layer 450. Thus, the patterned semiconductor layer 120 may be prevented from producing characteristic changes due to the irradiation of the light L, so that the transistor structure 40 has an ideal reliability.

Furthermore, in the present embodiment, the insulation layer 130 has the first opening 132, and the protective layer 460 has a second opening 462, wherein the first opening 132 and the second opening 462 are mutually connected and may expose a portion of the drain 110b. The exposed portion of the drain 110b may be provided for being coupled with the other components and driving the other components. When the transistor structure 40 is applied to a display panel, the portion of the drain 110b exposed by the first opening 132 and the second opening 462 is then used as a pixel electrode for driving a display medium. In the present embodiment, the second opening 462 is set to be slightly larger than the first opening 132, and a distance d2 between the edge of first opening 132 and the edge of the second opening 462 may be 3 μm to 5 μm, less than 0.5 μm, or even smaller, but the disclosure is not limited thereto. In other embodiments, the second opening 462 may selectively be set as slightly less than or equal to the first opening 132. When the second opening 462 is set as equal to the first opening 132, these two openings can even be form by adopting a same mask and be formed by being patterned in different steps.

Figure 5:
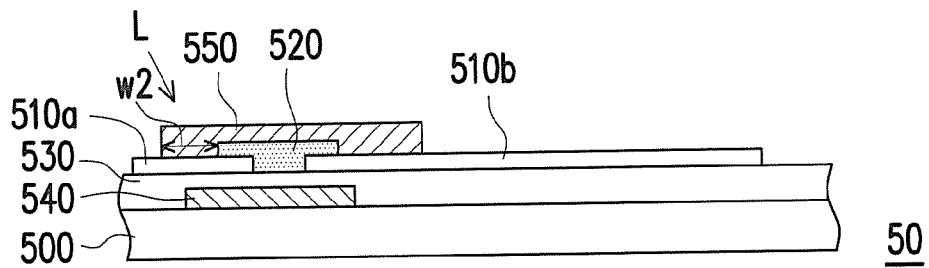
FIG. 5 is a schematic cross-sectional diagram illustrating a transistor structure according to a fifth embodiment of the disclosure.

FIG. 5 is a schematic cross-sectional diagram illustrating a transistor structure according to a fifth embodiment of the disclosure. Referring to FIG. 5, in the present embodiment, a transistor structure 50 is disposed on a substrate 500 and includes a gate 540, an insulation layer 530, a source 510a, a drain 510b, a patterned semiconductor layer 520 and a light absorption layer 550. The gate 540 is disposed on the substrate 500. An area of the gate 540 overlaps an area of the patterned semiconductor layer 520. The insulation layer 530 is located between the gate 540 and the patterned semiconductor layer 520. The source 510a and the drain 510b are separated from each other, and the source 510a and the drain 510b respectively contact the patterned semiconductor layer 520. The patterned semiconductor layer 520 is located between the light absorption layer 550 and the substrate 500.

Specifically, as shown in FIG. 5, in the manufacturing steps of the present embodiment, the gate 540 is firstly disposed on the substrate 500, wherein the substrate 500 may be a flexible substrate or a rigid substrate. Then, the insulation layer 530 is disposed on the gate 540 and overlaps the gate 540 and the substrate 500. Next, the source 510a and the drain 510b are disposed on the insulation layer 530 and expose a portion of the insulation layer 530. Subsequently, the patterned semiconductor layer 520 is disposed on the source 510a and the drain 510b and overlaps the exposed portion of the insulation layer 530. Afterward, the light absorption layer 550 is disposed on the patterned semiconductor layer 520. The gate 540 of the present embodiment is located between the patterned semiconductor layer 520 and the substrate 500, and thus the transistor structure 50 of the present embodiment is a bottom gate transistor structure.

In the present embodiment, an area of the light absorption layer 550 overlaps the area of the patterned semiconductor layer 520, and an absorption spectrum of the light absorption layer 550 overlaps an absorption spectrum of the patterned semiconductor layer 520. In detail, a material of the patterned semiconductor layer 520 includes organic semiconductor material, inorganic semiconductor material or oxide semiconductor material, such as an indium gallium zinc oxide and such material has an absorption spectrum ranges from 350 nm to 850 nm. Moreover, the light absorption layer 550 has the absorption spectrum overlapping that of the patterned semiconductor layer 520, such as from 290 nm to 900 nm. More favorably, when a thickness of the light absorption layer 550 is greater than 1 μm, the light absorption layer 550 may effectively absorb a portion of the light L irradiated from the outside towards the patterned semiconductor layer 520 that has the specific wavelength within the absorption spectrum. As a result, the portion of the light L irradiated from the outside towards the patterned semiconductor layer 520, which would be absorbed by the patterned semiconductor layer 520 may effectively and firstly be absorbed by the light absorption layer 550, thereby achieving a favorable effect of preventing the patterned semiconductor layer 520 from producing characteristic changes due to the irradiation of the light L. However, the thickness of the light absorption layer 550 may be adjusted according to the material being selected. As an absorption rate of the selected material within the range of the aforementioned absorption spectrum becomes higher, the light absorption layer 550 may attain an ideal absorption effect without being very thick in thickness. Relatively, as an absorption rate of the selected material within the range of the aforementioned absorption spectrum becomes lower, the thickness of the light absorption layer 550 must be relatively thicker so as to attain an ideal absorption effect.

In addition to the above, since a sheet resistance value of the light absorption layer 550 ranges between $10^{12}$ ohm/unit area and $10^{15}$ ohm/unit area, the light absorption layer 550 may configured as in direct contact with the patterned semiconductor layer 520. Namely, the light absorption layer 550 and the patterned semiconductor layer 520 do not have to sandwich an insulation layer therebetween. In the present embodiment, the light absorption layer 550 extends a width w2 outward from the edge of the patterned semiconductor layer 520, so as to cover the patterned semiconductor layer 520, wherein the area of the light absorption layer 550 may be 100% to 120% of the area patterned semiconductor layer 520. Certainly, in other embodiments, the sizes of the areas may be adjusted according to the processing conditions and the layout designs of the components. According to the above, a material of the light absorption layer 550 may, for example, be a black photoresist or a light absorbable dark color material, wherein an additive in the black photoresist includes at least one of a dye, a carbon black and a titanium metal. In addition, the transistor structure 50 of the present embodiment may further include a protective layer (not shown) covering the light absorption layer 550, the source 510a, the drain 510b and the insulation layer 530.

Figure 6:
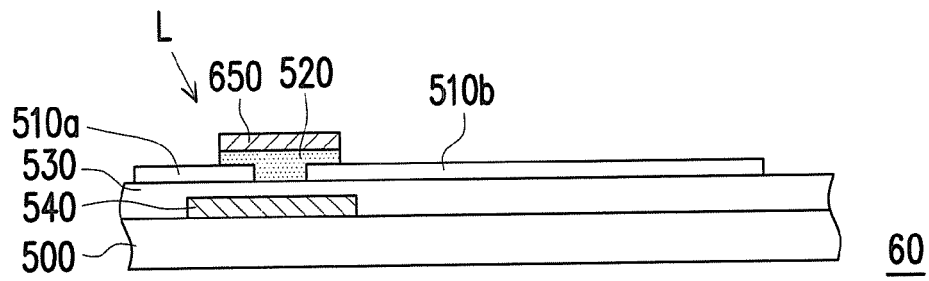
FIG. 6 is a schematic cross-sectional diagram illustrating a transistor structure according to a sixth embodiment of the disclosure.

FIG. 6 is a schematic cross-sectional diagram illustrating a transistor structure according to a sixth embodiment of the disclosure. Referring to FIG. 6, in the present embodiment, a transistor structure 60 is similar to the transistor structure 50, and similar components in the both embodiments are indicated by same notations and have similar functions; and thus further elaborations are omitted. A main difference between the transistor structure 60 and the transistor structure 50 lies in that a profile of a light absorption layer 650 and a profile of the patterned semiconductor layer 520 are aligned or almost aligned. In other words, as compared to the manufacturing method of the transistor structure 50, the transistor structure 60 of the present embodiment may reduce the use of a mask.

In detail, after the source 510a and the drain 510b are disposed on the insulation layer 530 and exposing a portion of the insulation layer 530, a gate semiconductor material layer (not shown) and a light absorption material layer may sequentially be deposited on the insulation layer 530, and then these two layers are patterned using a same mask to form the patterned semiconductor layer 520 and the light absorption layer 650, thereby forming the transistor structure 60 having the profile of the light absorption layer 650 and the profile of the patterned semiconductor layer 520 being aligned or almost aligned. Otherwise, the patterned semiconductor layer 520 and the light absorption layer 650 may be formed by being patterned using the same mask under different manufacturing steps. According to the abovementioned manufacturing method of the transistor structure 60, an area of the light absorption layer 650 overlaps the area of the patterned semiconductor layer 520, wherein the area of the light absorption layer 650 may completely overlap or at least overlap over 95% of the area of the patterned semiconductor layer 520.

In the present embodiment, the light absorption layer 650 has an absorption spectrum within the range from 290 nm to 900 nm, and the area of the light absorption layer 650 overlaps the area of the patterned semiconductor layer 520. As such, the patterned semiconductor layer 520 may be prevented from producing characteristic changes due to the irradiation of the light L.

Figure 7:
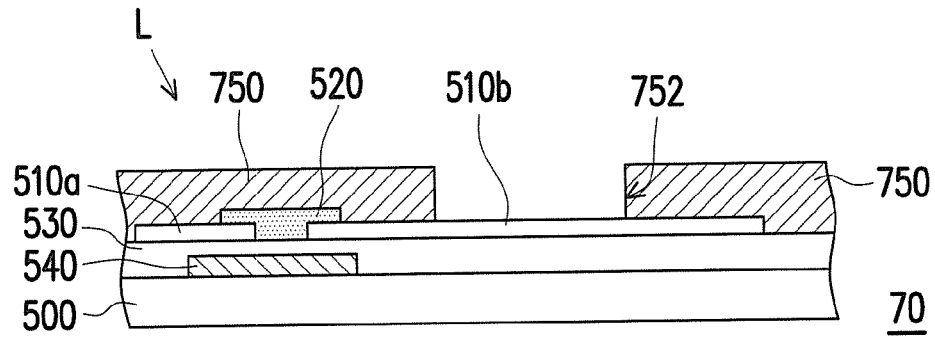
FIG. 7 is a schematic cross-sectional diagram illustrating a transistor structure according to a seventh embodiment of the disclosure.

FIG. 7 is a schematic cross-sectional diagram illustrating a transistor structure according to a seventh embodiment of the disclosure. Referring to FIG. 7, in the present embodiment, a transistor structure 70 is similar to the transistor structure 50, and similar components in the both embodiments are indicated by same notations and have similar functions; and thus further elaborations are omitted. A main difference between the transistor structure 70 and the transistor structure 50 lies in that a light absorption layer 750 extends outward from the patterned semiconductor layer 520 to contact a majority of the area of the insulation layer 530.

In detail, after the patterned semiconductor layer 520 is formed on the source 510a and the drain 510b, a light absorption layer 750 is then formed on the patterned semiconductor layer 520 and the light absorption layer 750 overlaps a portion of the insulation layer 530. Wherein, since the light absorption layer 750 extends outward from the patterned semiconductor layer 520 to contact the majority of the area of the insulation layer 530, the light absorption layer 750 of the present embodiment has functions of a protective layer, and thus subsequent processing steps for manufacturing a protective layer may be omitted. According to the abovementioned manufacturing method of the transistor structure 70, since the light absorption layer 750 extends outward from the patterned semiconductor layer 520 to overlap the majority of the area of the insulation layer 530, and an area of the light absorption layer 750 also overlaps the area of the patterned semiconductor layer 52.

In the present embodiment, when the light absorption layer 750 has an absorption spectrum within the range from 290 nm to 900 nm, and the area of the light absorption layer 750 overlaps the area of the patterned semiconductor layer 520, the patterned semiconductor layer 520 may be prevented from producing characteristic changes due to the irradiation of the light L. Furthermore, in the present embodiment, the light absorption layer 750 has an opening 752 and may expose a portion of the drain 510b through the opening 752. The exposed portion of the drain 510b may be provided for coupling with the other components or driving the other components. When the transistor structure 70 is applied to a display panel, the portion of the drain 510b exposed by the opening 752 is then used as a pixel electrode for driving a display medium.

Figure 8:
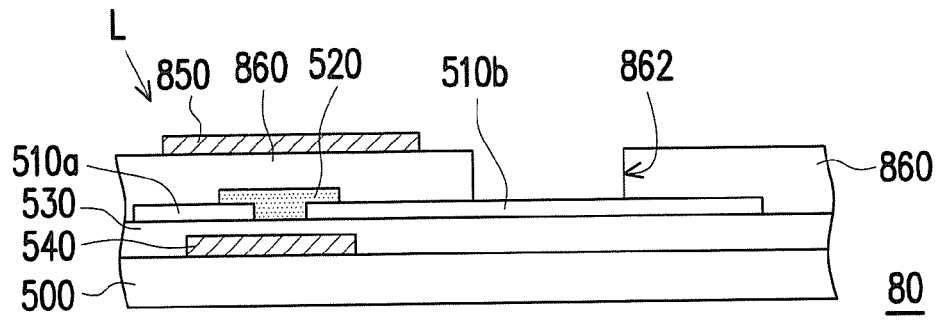
FIG. 8 is a schematic cross-sectional diagram illustrating a transistor structure according to an eighth embodiment of the disclosure.

FIG. 8 is a schematic cross-sectional diagram illustrating a transistor structure according to an eighth embodiment of the disclosure. Referring to FIG. 8, in the present embodiment, a transistor structure 80 is similar to the transistor structure 50, and similar components in the both embodiments are indicated by same notations and have similar functions; and thus further elaborations are omitted. A main difference between the transistor structure 80 and the transistor structure 50 lies in that a transistor structure 80 further includes a protective layer 860 covering the patterned semiconductor layer 520, the source 510a and a portion of the drain 510b. In addition, the protective layer 860 is located between a light absorption layer 850 and the substrate 500.

In detail, after the patterned semiconductor layer 520 is formed on the source 510a and the drain 510b and overlapping a portion of the insulation layer 530, the protective layer 860 is then formed on the patterned semiconductor layer 520. Wherein, the protective layer 860 extends outward from the patterned semiconductor layer 520 to overlap a majority of the area of the insulation layer 530. Then, the light absorption layer 850 is formed on the protective layer 860, wherein an area of the light absorption layer 850 overlaps the area of the patterned semiconductor layer 520. In the present embodiment, the area of the light absorption layer 850 may completely shield the area of the patterned semiconductor layer 520, or the area of the light absorption layer 850 may shield over 95% of the area of the patterned semiconductor layer 520, so that the transistor 80 may have favorable reliability.

In the present embodiment, the light absorption layer 850 has an absorption spectrum ranges from 290 nm to 900 nm, and the area of the light absorption layer 850 overlaps the area of the patterned semiconductor layer 520, and thus the patterned semiconductor layer 520 may be prevented from producing characteristic changes due to the irradiation of the light L. Furthermore, in the present embodiment, the protective layer 860 has an opening 862, and thus a portion of the drain 510b may be exposed by the opening 862. The exposed portion of the drain 510b may be provided for coupling with the other components or driving the other components. When the transistor structure 80 is applied to a display panel, the portion of the drain 510b exposed by the opening 862 is then used as a pixel electrode for driving a display medium.

Figure 9:
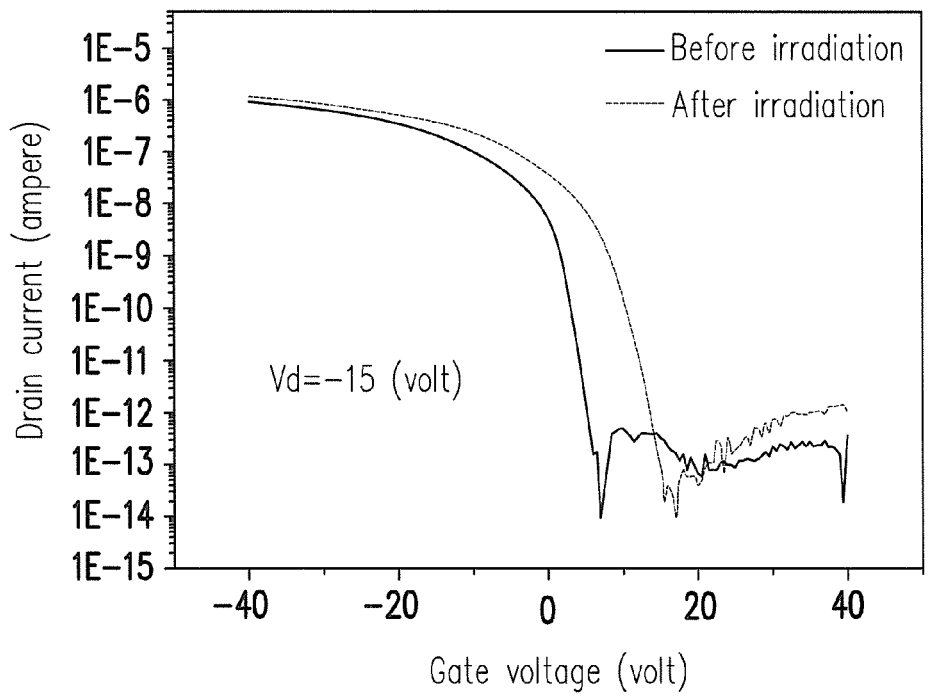
FIG. 9 is a characteristic curve diagram of a conventional transistor before and after being irradiated by light.
Figure 10:
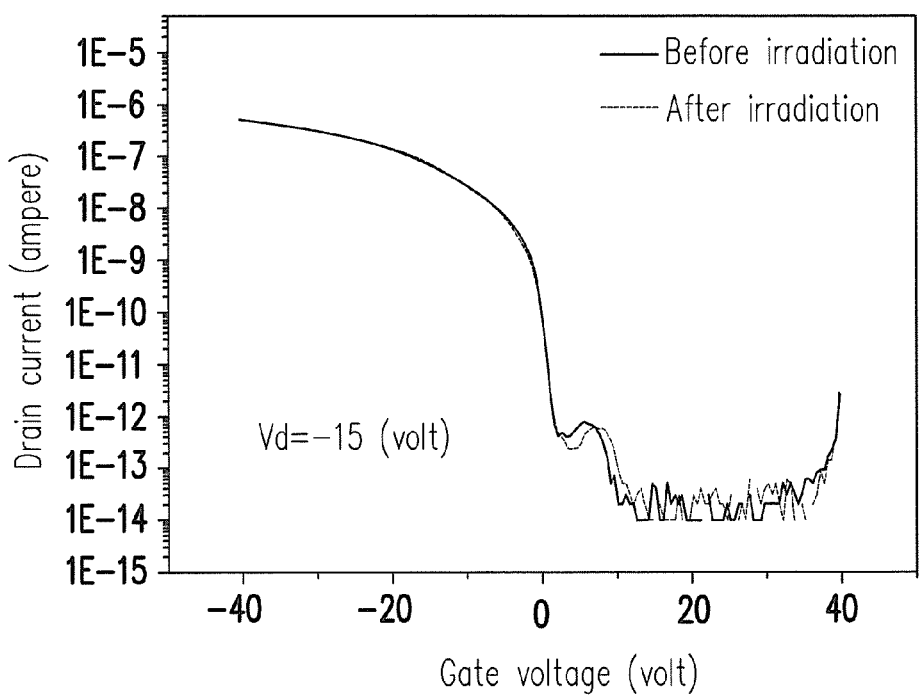
FIG. 10 is a characteristic curve diagram of a transistor of an embodiment of the disclosure before and after being irradiated by light.

FIG. 9 is a characteristic curve diagram of a conventional transistor before and after being irradiated by light. FIG. 10 is a characteristic curve diagram of a transistor of an embodiment of the disclosure before and after being irradiated by light. FIG. 9 and FIG. 10 are characteristic curve diagrams illustrating measurements of the drain currents corresponded to the gate voltages of the transistor that change from −40V to +40V under a condition of the drain voltage being −15 volts, wherein the vertical axis represents the drain current (ampere) of the transistor, the horizontal axis represents the gate voltage (volt) of the transistor, the solid line represents the characteristic curve of the transistor under the condition of not being irradiated by the light, and the broken line represents the characteristic curve of the transistor after being irradiated by the light. Moreover, in the experiment of FIG. 9, the transistor structure does not include an absorption layer; whereas in the experiment of FIG. 10, the transistor structure includes an absorption layer located above the semiconductor layer. In addition, the selected absorption layer has an absorption spectrum ranges from 290 nm to 900 nm. Moreover, in the two experiments, the light irradiated on the transistor structure has a power of 5 W (white light LED), and an irradiation distance thereof is 15 cm.

In detail, it can be observed from FIG. 9 that after the conventional transistor is irradiated by the light-emitting diodes for 10 seconds, the characteristic curve thereof shifts towards the right. Relatively, it can be observed from FIG. 10, after the transistor of the embodiment of the disclosure is irradiated by the light-emitting diodes for 10 seconds, the characteristic curve thereof almost overlaps with the original characteristic curve (which is before the irradiation). In other words, the semiconductor layer in the conventional transistor is prone to produce changes in its characteristics, such as threshold voltage, drive current and subthreshold slope, after subjected to the irradiation of the light, and thus causes a reduction in the reliability of the transistor structure. Nevertheless, because the transistor structure of the disclosure has a light absorption layer, even if the transistor structure is irradiated by the light, the semiconductor layer therein is not prone to produce changes in its characteristics, such as threshold voltage, drive current and subthreshold slope, and thereby maintain stable transistor characteristics.

Figure 11:
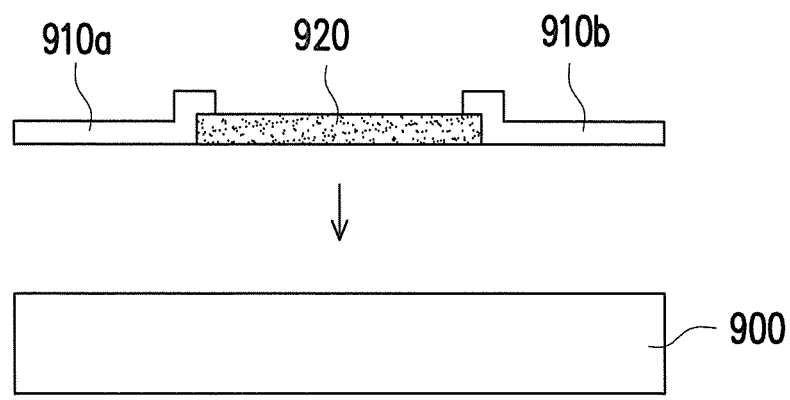
FIG. 11 is a schematic diagram illustrating a configuration relationship between a substrate, a patterned semiconductor layer, a source and a drain according to an embodiment of the disclosure.

In the previous embodiments, the source and the drain are both in contact with a side of the patterned semiconductor layer that is close to the substrate. However, the disclosure is not limited thereto. For instance, FIG. 11 is a schematic diagram illustrating a configuration relationship between the substrate, the patterned semiconductor layer, the source and the drain according to an embodiment of the disclosure. Referring to FIG. 11, a source 910a and a drain 910b may both be in contact with a side of a patterned semiconductor layer 920 that is away from a substrate 900. Now, the patterned semiconductor layer 920 has a portion located between the source 910a and the substrate 900, and has another portion located between the drain 910b and the substrate 900. Moreover, the stacking relationship shown in FIG. 11 may be applied to any one of FIG. 1 to FIG. 8.

In the abovementioned embodiment, the manufacturing method of each component may be referred back to the descriptions provided in the first embodiment, but the manufacturing order may be performed based on the stacking order of the components in the individual embodiment. For instance, in the embodiment of FIG. 4, after manufacturing the gate 140 and before manufacturing the light absorption layer 450, the protective layer 460 is manufactured. In terms of the embodiment of FIG. 5, the manufacturing order of the transistor 50 is to firstly manufacture the gate 540, manufacture the insulation layer 530, manufacture the source 510a and the drain 510b, then manufacture the patterned semiconductor layer 520, and finally manufacture the light absorption layer 550. Moreover, in the embodiment of FIG. 8, after manufacturing the patterned semiconductor layer 520 and before manufacturing the light absorption layer 850, the protective layer 860 is manufactured. Furthermore, when the transistor adopts the stacking manner shown in FIG. 11, the source 910a and the drain 910b are manufactured after completing the manufacturing of the patterned semiconductor layer 920. In view of the above, the transistor structure of the disclosure has a light absorption layer, and since the light absorption layer has an absorption spectrum overlapped with that of the patterned semiconductor layer, and the area of the light absorption layer overlaps the area of the patterned semiconductor layer, a portion of the light irradiating toward the patterned semiconductor layer may be absorbed by the light absorption layer. Hence, the patterned semiconductor layer in the transistor structure may be prevented from producing changes in its characteristics, such as threshold voltage, drive current and subthreshold slope, due to the irradiation of the light, and thereby may enhance the reliability of the thin film transistor.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A transistor structure comprising:
   a gate disposed on a substrate;
   an insulation layer;
   a patterned semiconductor layer, an area of the gate overlapping an area of the patterned semiconductor layer, the insulation layer located between the gate and the patterned semiconductor layer;
   a source and a drain separated from each other, and the source and the drain contacting the patterned semiconductor layer;
   a light absorption layer, the patterned semiconductor layer located between the light absorption layer and the substrate, and an area of the light absorption layer overlapping the area of the patterned semiconductor layer, wherein an absorption spectrum of the light absorption layer overlaps an absorption spectrum of the patterned semiconductor layer; and
   a protective layer, wherein the gate is located between the protective layer and the insulation layer, and the protective layer is located between the light absorption layer and the substrate.

2. The transistor structure as recited in claim 1, wherein the wavelength of the absorption spectrum of the light absorption layer is from 290nm to 900nm.

3. The transistor structure as recited in claim 1, wherein a sheet resistance value of the light absorption layer ranged from $10^{12}$ ohm/unit area to $10^{15}$ ohm/unit area.

4. The transistor structure as recited in claim 1, wherein a material of the light absorption layer comprises black photoresist or light absorbable dark color material, and an additive in the black photoresist comprises any one of a dye, a carbon black and a titanium metal.

5. The transistor structure as recited in claim 1, wherein the patterned semiconductor layer is located between the gate and the substrate.

6. The transistor structure as recited in claim 1, wherein the protective layer covers the gate and the insulation layer.

7. The transistor structure as recited in claim 1, wherein the insulation layer has a first opening, the protective layer has a second opening, and the first opening is connected with the second opening to expose a portion of the drain.

8. The transistor structure as recited in claim 5, wherein the insulation layer has an opening, and the opening exposes a portion of the drain.

9. The transistor structure as recited in claim 1, wherein a material of the patterned semiconductor layer comprises organic semiconductor material or inorganic semiconductor material.

10. The transistor structure as recited in claim 1, wherein a material of the patterned semiconductor layer comprises oxide semiconductor material.

11. The transistor structure as recited in claim 1, wherein the substrate is a flexible substrate.

12. The transistor structure as recited in claim 1, wherein the source contacts the drain at a side of the patterned semiconductor layer that is close to the substrate.

13. The transistor structure as recited in claim 1, wherein the source contacts the drain at a side of the patterned semiconductor layer that is away from the substrate.

14. A of manufacturing method a transistor structure comprising:
   forming a gate on a substrate;
   forming an insulation layer and a patterned semiconductor layer, an area of the gate overlapping an area of the patterned semiconductor layer, the insulation layer located between the gate and the patterned semiconductor layer;
   forming a source and a drain separated from each other, and the source and the drain in contact with the patterned semiconductor layer;
   forming a light absorption layer so that the patterned semiconductor layer is located between the light absorption layer and the substrate, and an area of the light absorption layer overlapping the area of the patterned semiconductor layer, wherein an absorption spectrum of the light absorption layer overlaps an absorption spectrum of the patterned semiconductor layer; and
   forming a protective layer, the gate being located between the protective layer and the insulation layer, wherein the protective layer is located between the light absorption layer and the substrate.

15. The manufacturing method of the transistor structure as recited in claim 14, wherein the light absorption layer is manufactured by either a dry processing or a wet processing.

16. The manufacturing method of the transistor structure as recited in claim 15, wherein the wet processing comprises performing a coating process on the substrate.

17. The manufacturing method of the transistor structure as recited in claim 15, wherein the wet processing comprises performing a coating process in a roll-to-roll device.

18. The manufacturing method of the transistor structure as recited in claim 15, wherein the dry processing comprises either a physical deposition or a chemical deposition.

19. The manufacturing method of the transistor structure as recited in claim 14, wherein the patterned semiconductor layer is manufactured by either a dry processing or a wet processing.

20. The manufacturing method of the transistor structure as recited in claim 19, wherein the dry processing is performed in a vacuum equipment.

21. A transistor structure comprising:
a gate disposed on a substrate;
an insulation layer;
a patterned semiconductor layer, an area of the gate overlapping an area of the patterned semiconductor layer, and the insulation layer located between the gate and the patterned semiconductor layer;
a source and a drain separated from each other, and the source and the drain contacting the patterned semiconductor layer;
a light absorption layer, the patterned semiconductor layer located between the light absorption layer and the substrate, and an area of the light absorption layer overlapping the area of the patterned semiconductor layer, wherein an absorption spectrum of the light absorption layer overlaps an absorption spectrum of the patterned semiconductor layer; and
a protective layer, the gate being located between the protective layer and the insulation layer, wherein the insulation layer has a first opening, the protective layer has a second opening, and the first opening is connected with the second opening to expose a portion of the drain.

* * * * *